(12) United States Patent
Lu

(10) Patent No.: US 12,557,271 B2
(45) Date of Patent: Feb. 17, 2026

(54) METHOD FOR FORMING SEMICONDUCTOR STRUCTURE AND SEMICONDUCTOR STRUCTURE

(71) Applicant: CHANGXIN MEMORY TECHNOLOGIES, INC., Hefei (CN)

(72) Inventor: Jingwen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 861 days.

(21) Appl. No.: 17/844,242

(22) Filed: Jun. 20, 2022

(65) Prior Publication Data

US 2022/0320110 A1 Oct. 6, 2022

Related U.S. Application Data

(63) Continuation of application No. PCT/CN2021/110982, filed on Aug. 5, 2021.

(30) Foreign Application Priority Data

Sep. 23, 2020 (CN) .......................... 202011012799.8

(51) Int. Cl.
*H10B 12/00* (2023.01)
(52) U.S. Cl.
CPC ......... *H10B 12/482* (2023.02); *H10B 12/315* (2023.02); *H10B 12/485* (2023.02)
(58) Field of Classification Search
CPC ............ H10B 12/0335; H10B 12/482; H10B 12/315; H10B 12/485; H10B 12/30; H10B 12/02
See application file for complete search history.

(56) References Cited

U.S. PATENT DOCUMENTS 9,165,859 B2 10/2015 Lim
9,202,774 B2 12/2015 Yeom
(Continued)

FOREIGN PATENT DOCUMENTS

CN 104347592 A 2/2015
CN 107799462 A 3/2018
(Continued)

OTHER PUBLICATIONS

International Search Report in the international application No. PCT/CN2021/110982, mailed on Nov. 3, 2021, 5 pages.
(Continued)

*Primary Examiner* — Ori Nadav
*Assistant Examiner* — Stephen Lee Johnson, Jr.
(74) *Attorney, Agent, or Firm* — SYNCODA LLC; Feng Ma

(57) ABSTRACT

A method for forming a semiconductor structure includes that a semiconductor substrate is provided, on which bit line structures and dielectric layers that are formed, in which the bit line structures and the dielectric layers jointly define capacitor contact openings; first conductive layers filling the capacitor contact openings are formed, in which top surfaces of the first conductive layers are lower than top surfaces of the bit line structures; conductive contact layers located on the top surfaces of the first conductive layers are formed, in which a thickness of a first part and/or a thickness of a second part of each conductive contact layer is greater than a thickness of a third part thereof; second conductive layers electrically connected with the conductive contact layer are formed, and are configured to adjust an arrangement mode of capacitor contact structures formed by filling the capacitor contact openings.

17 Claims, 22 Drawing Sheets

(56) References Cited

U.S. PATENT DOCUMENTS

| | | |
|---|---|---|
| 9,337,202 B2 | 5/2016 | Lim |
| 9,466,603 B2 | 10/2016 | Yeom |
| 10,930,655 B2 | 2/2021 | Kim |
| 2005/0280035 A1* | 12/2005 | Lee .................... H10B 12/0335 |
| | | 257/E21.507 |
| 2006/0246656 A1 | 11/2006 | Kudelka et al. |
| 2014/0299989 A1 | 10/2014 | Lim et al. |
| 2015/0035050 A1 | 2/2015 | Yeom et al. |
| 2016/0005743 A1 | 1/2016 | Lim et al. |
| 2016/0049409 A1 | 2/2016 | Yeom et al. |
| 2020/0020697 A1 | 1/2020 | Kim et al. |
| 2020/0203354 A1* | 6/2020 | Lee ........................ H10B 12/02 |
| 2020/0388620 A1* | 12/2020 | Park ..................... H10B 12/315 |
| 2021/0134808 A1 | 5/2021 | Kim et al. |

FOREIGN PATENT DOCUMENTS

| | | |
|---|---|---|
| CN | 107910328 A | 4/2018 |
| CN | 207489874 U | 6/2018 |
| CN | 110970436 A | 4/2020 |
| CN | 111524887 A | 8/2020 |
| TW | 200711052 A | 3/2007 |

OTHER PUBLICATIONS

Supplementary European Search Report in the European application No. 21871094.5, mailed on Jan. 10, 2024, 8 1 pages.

\* cited by examiner

METHOD FOR FORMING SEMICONDUCTOR STRUCTURE AND SEMICONDUCTOR STRUCTURE

CROSS-REFERENCE TO RELATED APPLICATIONS

The present application is a continuous application of International Application No. PCT/CN2021/110982, filed on Aug. 5, 2021, which claims priority to Chinese Patent Application No. 202011012799.8, filed on Sep. 23, 2020. The disclosures of International Application No. PCT/CN2021/110982 and Chinese Patent Application No. 202011012799.8 are hereby incorporated by reference in their entireties.

BACKGROUND

In a dynamic random access memory (DRAM), the electrical connection between a transistor and a capacitor needs to be achieved by depositing a capacitor contact structure, in which a resistance of the capacitor contact structure formed by depositing affects a current between the transistor and the capacitor, thereby affecting the electrical conductivity of a device.

An existing method for forming a capacitor contact structure cannot effectively reduce a resistance of the formed capacitor contact structure, so that the electrical conductivity of the formed DRAM is affected.

SUMMARY

The present disclosure relates to the field of semiconductors, and in particular to a method for forming a semiconductor structure and a semiconductor structure.

Embodiments of the present disclosure provide a method for forming a semiconductor structure, including the following operations. A semiconductor substrate is provided, on which bit line structures and dielectric layers that are discretely arranged are formed, in which an extension direction of the dielectric layers is intersected with an extension direction of the bit line structures, and the bit line structures and the dielectric layers jointly define discrete capacitor contact openings. First conductive layers for filling the capacitor contact openings are formed, in which top surfaces of the first conductive layers are lower than top surfaces of the bit line structures. Conductive contact layers located on the top surfaces of the first conductive layers are formed, in which a thickness of a first part and/or a thickness of a second part of each conductive contact layer is greater than a thickness of a third part thereof. The first part is a part of a conductive contact layer in contact with a bit line structure, the second part is a part of the conductive contact layer in contact with the dielectric layer, and the first part, the second part and the third part together constitute the conductive contact layer. Second conductive layers that are discretely arranged and electrically connected with the conductive contact layers are formed, in which the second conductive layers are configured to adjust an arrangement mode of capacitor contact structures formed by filling the capacitor contact openings.

Embodiments of the present disclosure further provide a semiconductor structure, including a semiconductor substrate, first conductive layers, conductive contact layers and second conductive layers. Bit line structures and dielectric layers are provided on the semiconductor substrate, an extension direction of the dielectric layers is intersected with an extension direction of the bit line structures, and the bit line structures and the dielectric layers jointly define discrete capacitor contact openings. The first conductive layers are located at the bottoms of the capacitor contact openings, and top surfaces of the first conductive layers are lower than top surfaces of the bit line structures. The conductive contact layers are located on the top surfaces of the first conductive layers. A thickness of a first part and/or a thickness of a second part of each conductive contact layer is greater than a thickness of a third part thereof, in which the first part is a contact part of a conductive contact layer in contact with a bit line structure, the second part is a contact part of the conductive contact layer in contact with the dielectric layer, and the first part, the second part and the third part together constitute the conductive contact layer. The second conductive layers are electrically connected with the conductive contact layers, and configured to adjust an arrangement mode of capacitor contact structures formed by filling the capacitive contact openings.

BRIEF DESCRIPTION OF THE DRAWINGS

One or more embodiments are exemplarily described by pictures in corresponding drawings, and unless otherwise stated, the pictures in the drawings do not constitute scale limitation.

DETAILED DESCRIPTION

Figure 1:
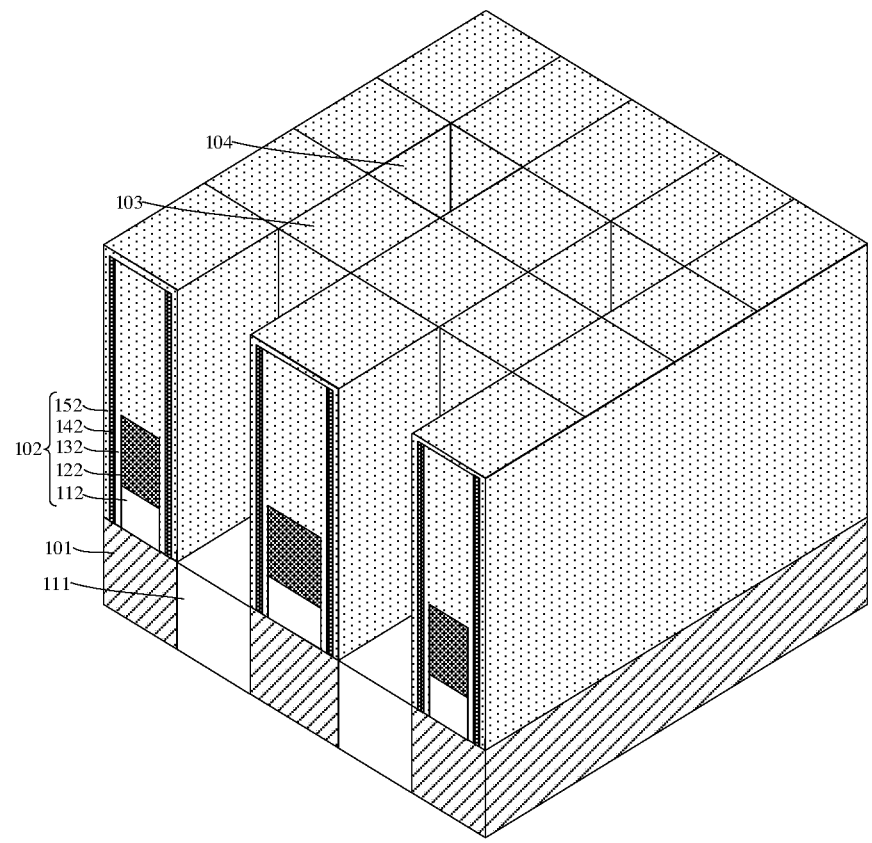
FIGS. 1-22 are structure schematic diagrams corresponding to each operation of a method for forming a semiconductor structure provided by the embodiments of the present disclosure.

At present, a method for forming a capacitor contact structure in a related art cannot effectively reduce a resistance of the formed capacitor contact structure, thereby affecting the electrical conductivity of the formed DRAM.

In order to solve the above problem, the embodiments of the present disclosure provide a method for forming a semiconductor structure, including the following operations. A semiconductor substrate is provided, on which bit line structures and dielectric layers that are discretely arranged are formed, in which an extension direction of the dielectric layers is intersected with an extension direction of the bit line structures, and the bit line structures and the dielectric layers jointly define discrete capacitor contact openings. First conductive layers for filling the capacitor contact openings are formed, in which top surfaces of the first conductive layers are lower than top surfaces of the bit line structures. Conductive contact layers located on the top surfaces of the first conductive layers are formed, in which a thickness of a first part and/or a thickness of a second part of each conductive contact layer is greater than a thickness of a third part thereof. The first part is a contact part of a conductive contact layer in contact with a bit line structure, the second part is a contact part of the conductive contact layer in contact with the dielectric layer, and the first part, the second part and the third part together constitute the conductive contact layer. Second conductive layers that are discretely arranged and electrically connected with the conductive contact layers are formed, in which the second conductive layers are configured to adjust an arrangement mode of capacitor contact structures formed by filling the capacitor contact openings.

In order to make objectives, technical solutions, and advantages of the embodiments of the present disclosure clearer, each embodiment of the present disclosure is described in detail below with reference to the drawings. However, a person of ordinary skill in the art may understand that in each embodiment of the present disclosure, many technical details are proposed for a reader to better understand the present disclosure. However, even without these technical details and various changes and modifications based on the following embodiments, the technical solutions claimed in the present disclosure may be implemented. The following divisions of the various embodiments are for convenience of descriptions, and should not constitute any limitation to implementation modes of the present disclosure. The various embodiments may be combined with each other and quoted mutually without contradiction.

FIGS. 1-22 are structure schematic diagrams corresponding to each operation of a method for forming a semiconductor structure provided by embodiments of the present disclosure, and the method for forming a semiconductor structure of the embodiments of the present disclosure is described in detail below.

Referring to FIG. 1, a semiconductor substrate 101 is provided, on which bit line structures 102 and dielectric layers 103 that are discretely arranged are formed, in which an extension direction of the dielectric layers 103 is intersected with an extension direction of the bit line structures 102, and the bit line structures 102 and the dielectric layers jointly define discrete capacitor contact openings 104.

Buried-type word lines, shallow-groove isolation structures, active areas 111 and other structures are included in the semiconductor substrate 101. Each bit line structure 102 includes a bottom dielectric layer (not shown), a bit line contact layer 112, a metal layer 122, and a top dielectric layer 132 stacked sequentially.

The material of the bit line contact layers 112 includes tungsten or polysilicon. The materials of the bottom dielectric layers (not shown) and the top dielectric layers 132 include silicon nitride, silicon dioxide or silicon oxynitride. The metal layers 122 may be composed of one conductive material or a plurality of conductive materials, such as doped polysilicon, titanium, titanium nitride, tungsten, a tungsten complex and the like.

The material of the dielectric layers 103 includes silicon nitride, silicon dioxide, or silicon oxynitride. In an embodiment of the present disclosure, the material of the dielectric layers 103 may be the same as the material of the top dielectric layers 132.

In an embodiment of the present disclosure, top surfaces and sidewalls of bit line structures 102 are further covered with a protection structure, in which the protection structure is configured to electrically isolate the bit line structures 102 from the capacitor contact structures formed subsequently.

In an embodiment of the present disclosure, the protection structure is a laminated structure including a top dielectric layer 132, a second dielectric layer 142, and a third dielectric layer 152 that are sequentially formed on the a sidewall of a bit line structure, in which the material of the third dielectric layer 152 may be the same as the material of the top dielectric layer 132, and the material of the second dielectric layer 142 and the material of the top dielectric layer 132 may be different. The protection structure is implemented in a laminated structure so as to have a better electrical isolation effect, and is configured to reduce parasitic resistance between bit line structures 102 and capacitor contact structures formed subsequently.

Areas defined by adjacent bit line structures 102 and adjacent dielectric layers 103 serves as the capacitor contact openings 104 which are configured to form the capacitor contact structures subsequently.

Figure 2:
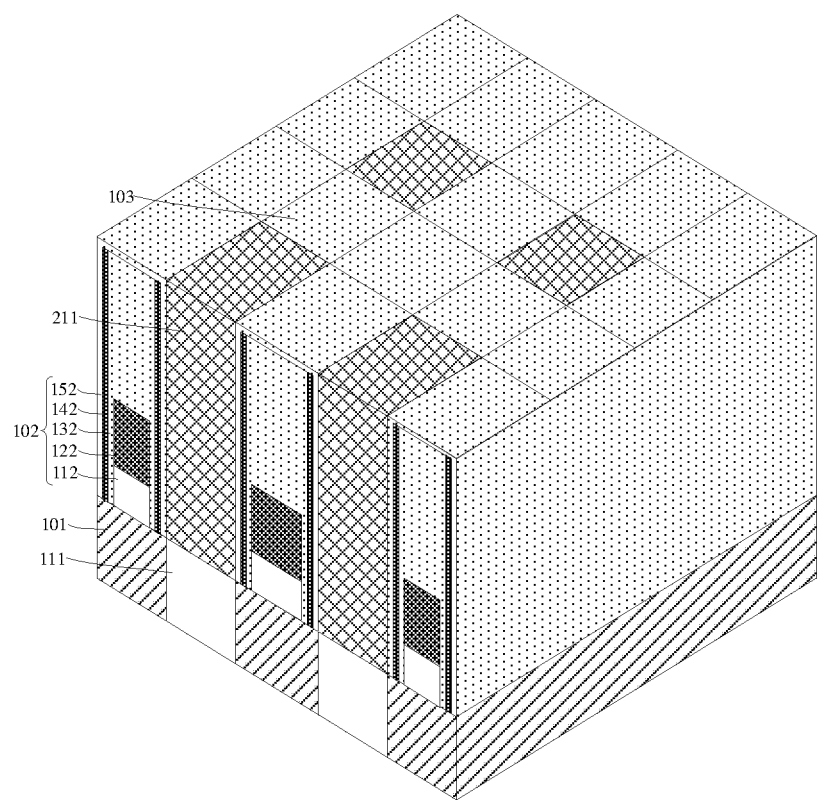
Figure 3:
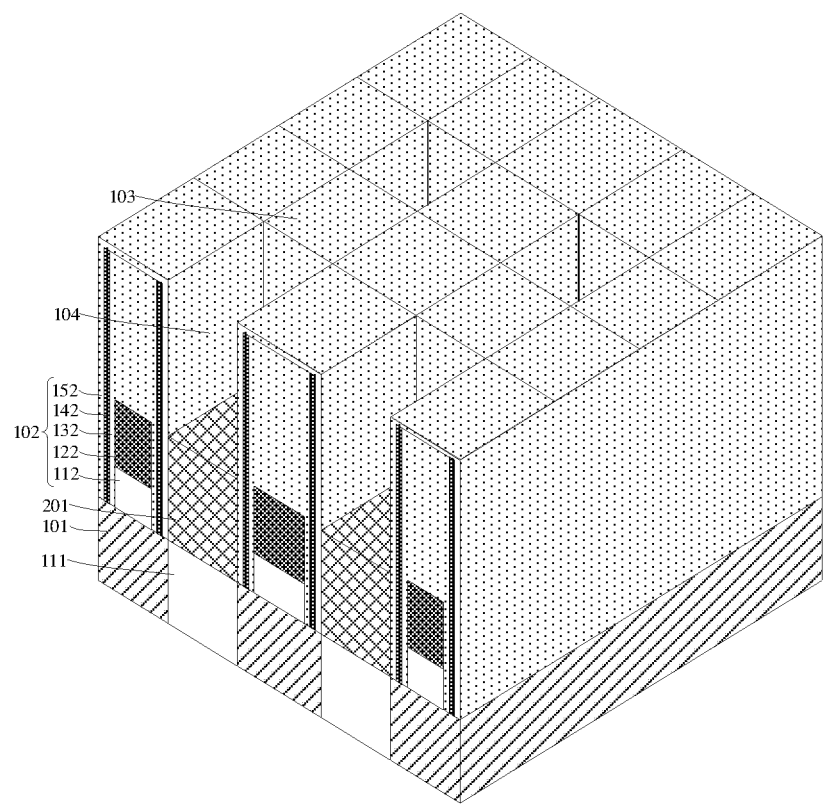

Referring to FIG. 2 and FIG. 3, first conductive layers 201 filling the capacitor contact openings 104 are formed, in which top surfaces of the first conductive layers 201 are lower than top surfaces of the bit line structures 102.

In some embodiments, a first conductive film (not shown) filling capacitor contact openings 104 is formed, in which the first conductive film (not shown) covers the bit line structures 102 and the dielectric layers 103.

Referring to FIG. 2, the first conductive film (not shown) is etched, until discrete first conductive structures 211 are formed.

In some embodiments, the first conductive film (not shown) is etched by chemical mechanical polishing, until top surfaces of the bit line structures 102 and the dielectric layers 103 are exposed, as to form the first conductive structures 211. The top of the first conductive film (not shown) is polished by chemical mechanical polishing, as to form the first conductive structures 211 discretely arranged. The chemical mechanical polishing has a higher removal rate compared to an etching process, and is beneficial to shorten a process period.

Referring to FIG. 3, the first conductive structures 211 of a partial thickness are etched to form the first conductive layers 201.

The first conductive layers 201 are bottom conductive layers of the capacitor contact structures formed subsequently, and are configured to electrically connect with the active areas 111 in the semiconductor substrate 101, and the material of the first conductive layers 201 includes semiconductor conductive materials such as doped polysilicon and polysilicon. In an embodiment of the present disclosure, the material of the first conductive layers 201 is doped polysilicon.

Figure 4:
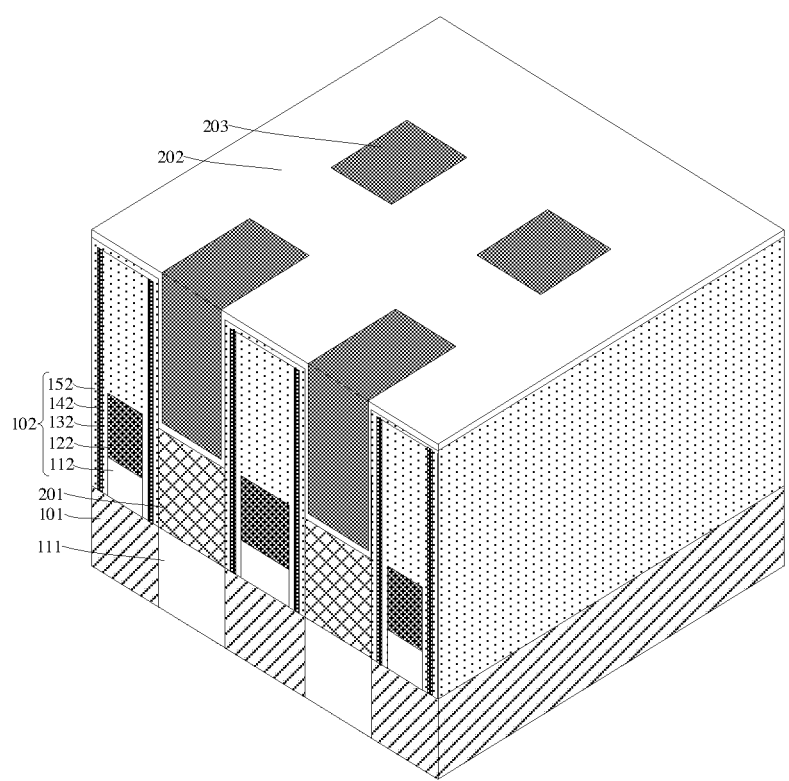
Figure 5:
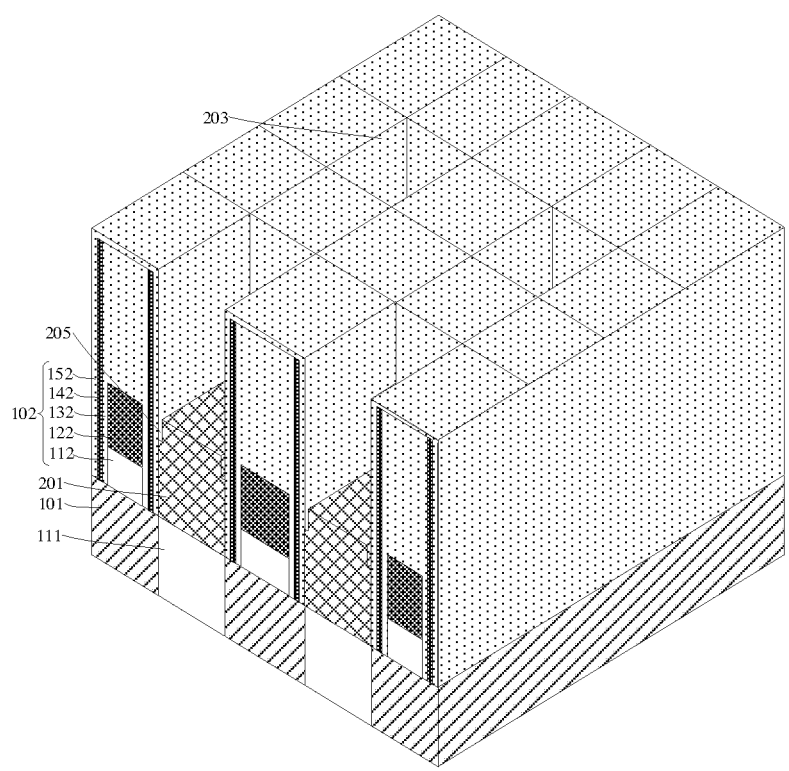

In an embodiment of the present disclosure, each formed first conductive layer 201 has a groove. Referring to FIG. 4 and FIG. 5, the groove 205 is formed in a first conductive layer 201, in which the groove 205 is located in a position of the first conductive layer 201 in contact with the bit line structures 102, and in a position of the first conductive layer 201 in contact with the dielectric layers 103. A method for forming the grooves 205 is as the follows.

Referring to FIG. 4, a first sacrificial layer 202 located on the tops and sidewalls of the bit line structures 102, the tops and sidewalls of the dielectric layers 103 and the tops of the first conductive layers 201 is formed. The material of the first sacrificial layer 202 is different from the materials of the dielectric layers 103 and the first conductive layers 201, so that it is selectively removed subsequently by etching using a wet etching technology. In an embodiment of the present disclosure, the material of the first sacrificial layer 202 is silicon oxide.

Barrier layers 203 for filling the capacitor contact openings 104 are formed. In an embodiment of the present disclosure, the material of the barrier layers 203 may be a photoresist.

In some embodiments, forming the barrier layers 203 includes the following operations. A barrier film (not shown) for filling the capacitor contact openings 104 is formed, in which a top surface of the barrier film (not shown) is higher than a top surface of the first sacrificial layer 202. The barrier film (not shown) is etched, so as to form the discrete barrier layers 203.

In some embodiments, the barrier film (not shown) is etched by chemical mechanical polishing, so as to form the barrier layers 203. The A top of the barrier film (not shown)

is polished by the chemical mechanical polishing, as to form the barrier layers 203 that are discretely arranged. The chemical mechanical polishing has a higher removal rate compared to an etching process, and is beneficial to shorten the process period.

Referring to FIG. 5, the first sacrificial layer located on the tops and sidewalls of the bit line structures 102 and the tops and sidewalls of the dielectric layers 103 is etched with the barrier layers 203 as a mask to form through holes (not shown), in which the first conductive layers 201 are exposed, A part of the first conductive layers 201 is etched on the basis of the through holes (not shown), as to form the grooves 205. The barrier layers 203 (referring to FIG. 4) and the remaining first sacrificial layer 202 (referring to FIG. 4) are moved.

Referring to FIGS. 6-12, conductive contact layers 206 located on the top surfaces of the first conductive layers 201 are formed. A thickness of a first part and/or a thickness of a second part of each conductive contact layer 206 are greater than a thickness of a third part thereof. The first part is a part of a conductive contact layer 206 in contact with bit line structures 102, the second part is a part of the conductive contact layer 206 in contact with dielectric layers 103, the third part is a middle part of the conductive contact layer 206, and each conductive contact layer 206 consist of the first part, the second part and the third part. In an embodiment of the present disclosure, the conductive contact layers 206, of which an edge thickness is greater than a middle thickness, are formed, so as to increase contact areas between the first conductive layers 201 and the second conductive layers formed subsequently, thereby reducing the resistance of the capacitor contact structures formed subsequently.

Embodiments of the present disclosure provide three different methods for forming the conductive contact layers 206 thereby forming the conductive contact layers 206 with different morphologies.

It should be noted that in the case where the conductive contact layers 206 are formed by the first method, no groove 205 needs to be formed in the first conductive layers 201, namely the first method is implemented on the basis of FIG. 3. In the case where the conductive contact layers 206 are formed by the second method or the third method, the grooves 205 need to be formed in the first conductive layers 201, namely the second method and the third method are implemented on the basis of FIG. 5.

Figure 6:
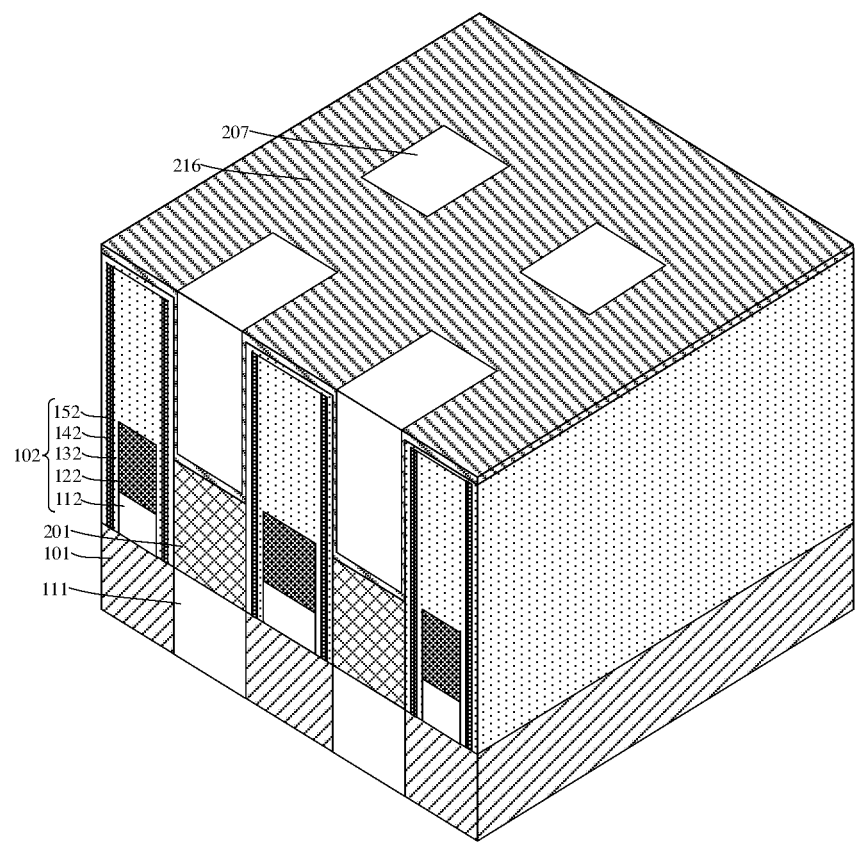
Figure 7:
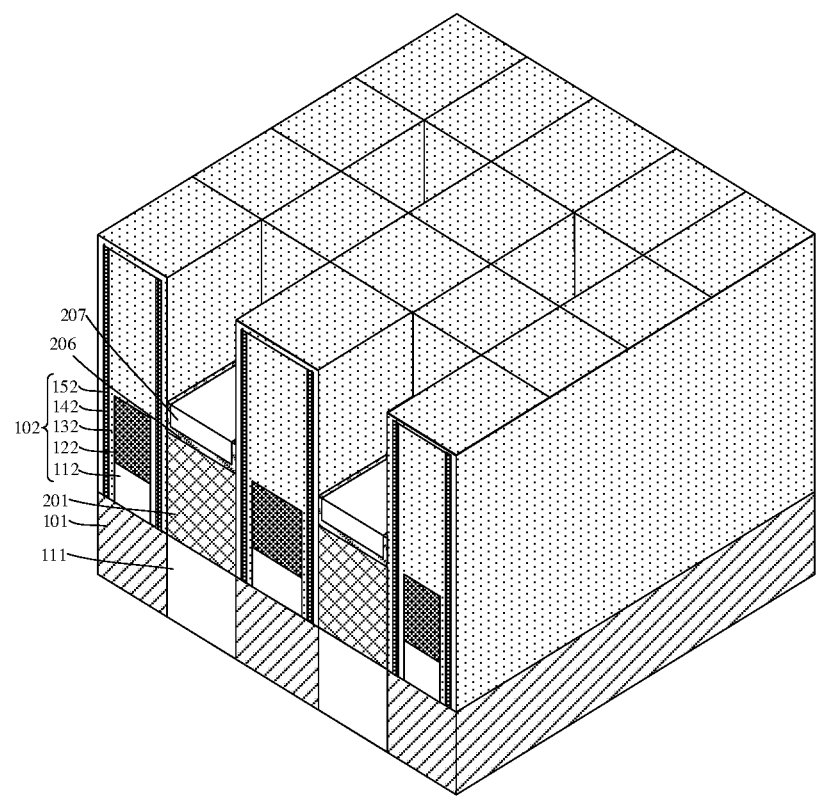
Figure 8:
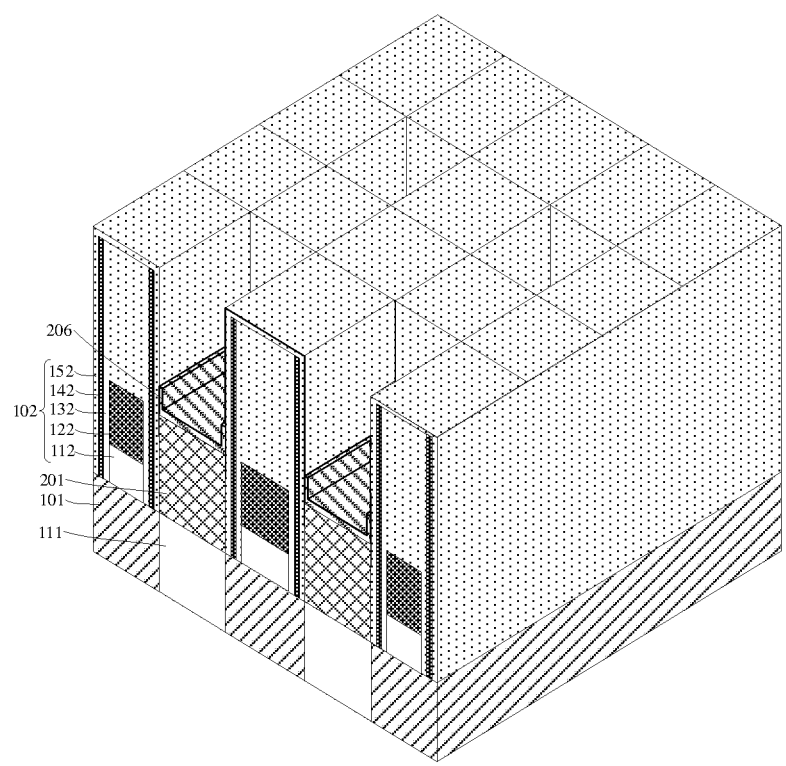

In the first method, referring to FIGS. 6-8, the conductive contact layers 206 located on the tops of the first conductive layers 201 are formed, in which top surfaces of the conductive contact layers 206 are higher than top surfaces of the bit line structures 102. Forming the conductive contact layers 206 includes the following operations.

Referring to FIG. 6, a conductive contact film 216 covering the top surfaces of the first conductive layers 201, the top surfaces and sidewalls of the bit line structures 102, the top surfaces and sidewalls of the dielectric layers 103 is formed, and second sacrificial layers 207 for filling openings in the conductive contact film 216 are formed.

The conductive contact film 216 is configured to form the conductive contact layers 206 subsequently. In an embodiment of the present disclosure, the material of the conductive contact film 216 is titanium nitride.

Referring to FIG. 7 and FIG. 8, a part of the conductive contact film 216 is removed by etching with the second sacrificial layers 207 as a mask to form the conductive contact layers 206 and etched through holes for exposing the conductive contact layers. The bottom surface of each etched through hole is higher than the top surface of each second sacrificial layer 207. Namely the height of the first part and the height of a second part of each etched through hole formed are higher than the height of a third part thereof. After the conductive contact layers 206 are formed, the second sacrificial layers 207 are removed. The morphology of the formed conductive contact layers 206 is as shown in FIG. 8.

Figure 9:
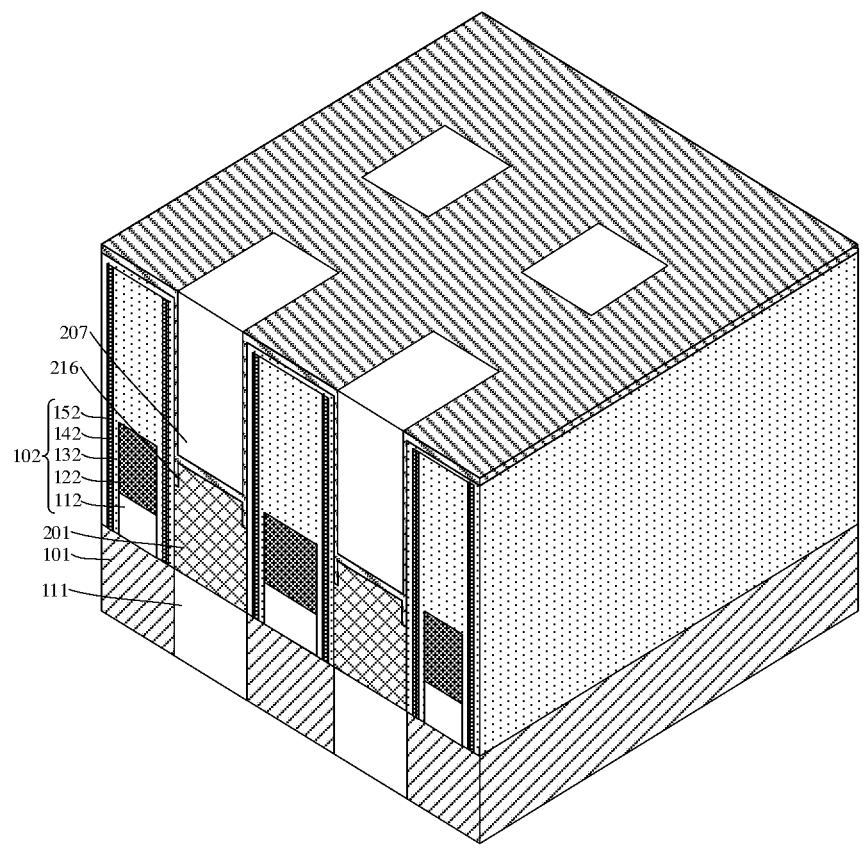
Figure 10:
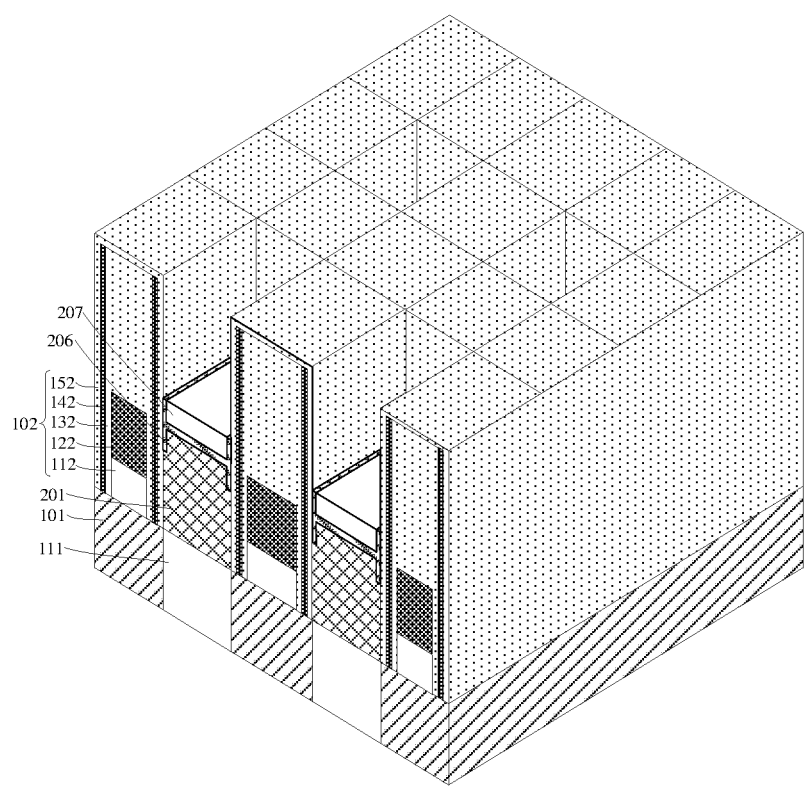
Figure 11:
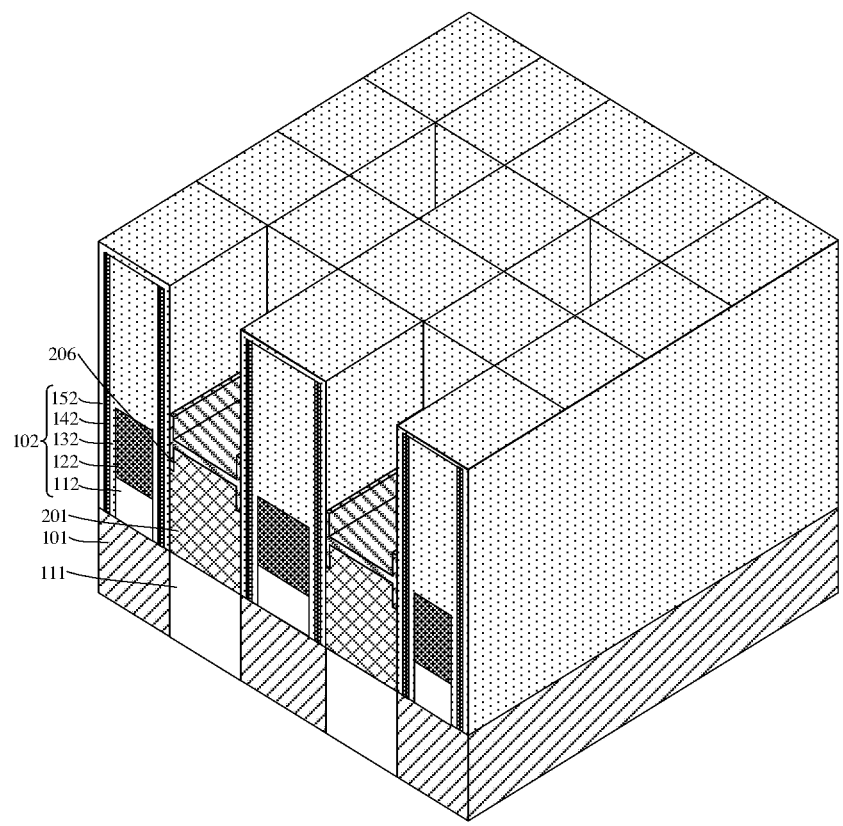

In the second method, referring to FIGS. 9-11, the conductive contact layers 206 for filling the grooves 205 and covering the first conductive layers 201 are formed, in which the top surfaces of the conductive contact layers 206 are higher than the top surfaces of the bit line structures 102. Forming the conductive contact layers 206 includes the following operations.

Referring to FIG. 9, the conductive contact film 216 for covering the top surfaces of the first conductive layers 201, the top surfaces and sidewalls of the bit line structures 102, and the top surfaces and sidewalls of the dielectric layers 103, and filling the grooves 205 is formed, and the second sacrificial layers 207 for filling the openings in the conductive contact film 216 are formed.

Referring to FIG. 10 and FIG. 11, a part of the conductive contact film 216 is removed by etching with the second sacrificial layers 207 as a mask to form the conductive contact layers 206 and etched through holes for exposing the conductive contact layers. The bottom surface of each etched through hole is higher than the top surface of each second sacrificial layer 207. Namely, the height of the first part and the height of the second part of each formed etched through hole are higher than the height of the third part thereof. After the conductive contact layers 206 are formed, the second sacrificial layers 207 are removed. The morphology of the formed conductive contact layers 206 is as shown in FIG. 11.

Figure 12:
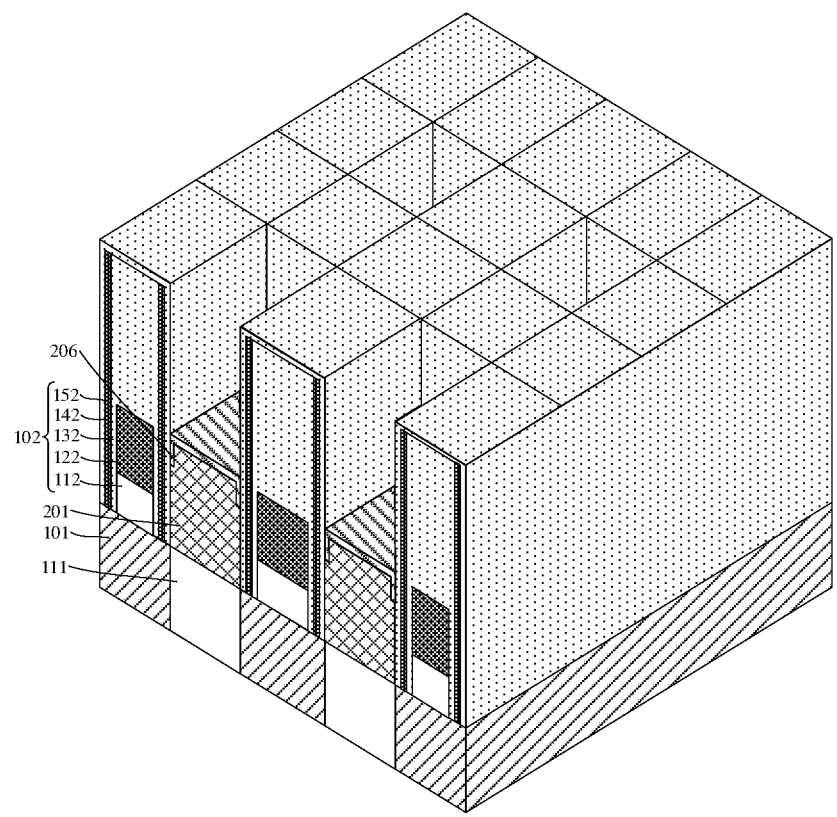

In the third method, referring to FIG. 9 and FIG. 12, the conductive contact layers 206 for filling the grooves 205 and covering the first conductive layers 201 are formed, in which the top surfaces of the conductive contact layers 206 are higher than the top surfaces of the bit line structures 102. The forming the conductive contact layers 206 includes the following operations.

Referring to FIG. 9, the conductive contact film 216 for covering the top surfaces of the first conductive layers 201, the top surfaces and sidewalls of the bit line structures 102, and the top surfaces and sidewalls of the dielectric layers 103, and filling the grooves 205 is formed, and the second sacrificial layers 207 for filling the openings in the conductive contact film 216 are formed.

Referring to FIG. 12, a part of the conductive contact film 216 is removed by etching with the second sacrificial layers 207 as a mask to form the conductive contact layers 206 and etched through holes for exposing the conductive contact layers. The bottom surface of each etched through hole is flush with the top surface of each second sacrificial layer 207, namely the height of the first part and the height of the second part of each formed etched through hole are higher than the height of the third part thereof. After the conductive contact layers 206 are formed, the second sacrificial layers 207 are removed. The morphology of the formed conductive contact layers 206 is as shown in FIG. 12.

In an embodiment of the present disclosure, a first height is less than or equal to a third height, and/or a second height is less than or equal to a third height. The first height is a height of the first parts in a direction perpendicular to the semiconductor substrate, the second height is a height of the second parts in a direction perpendicular to the semiconductor substrate, and the third height is a height of the capacitor contact openings in a direction parallel to the semiconductor substrate. By making the size of edge parts of the formed conductive contact layers 206 smaller than the size of the capacitor contact openings 104, the capacitor contact structures formed subsequently have a higher stability.

Referring to FIGS. 13-22, second conductive layers 301 electrically connected with the conductive contact layers 206 are formed, in which the second conductive layers 301 are configured to adjust an arrangement mode of the capacitor contact structures formed by filling the capacitor contact openings 104.

It should be noted that, FIGS. 13-22 are described based on the conductive contact layers 206 formed in FIG. 11 which are taken as an example, and does not constitute limitation to the premise of the second conductive layers 301. In other embodiments, the second conductive layers 301 may be further formed on the basis of the conductive contact layers 206 formed in FIG. 9 and FIG. 12.

Embodiments of the present disclosure provide two methods for forming the second conductive layers 301. The two methods for forming the second conductive layer 301 given in the embodiments are described in detail below with reference to the drawings.

Figure 13:
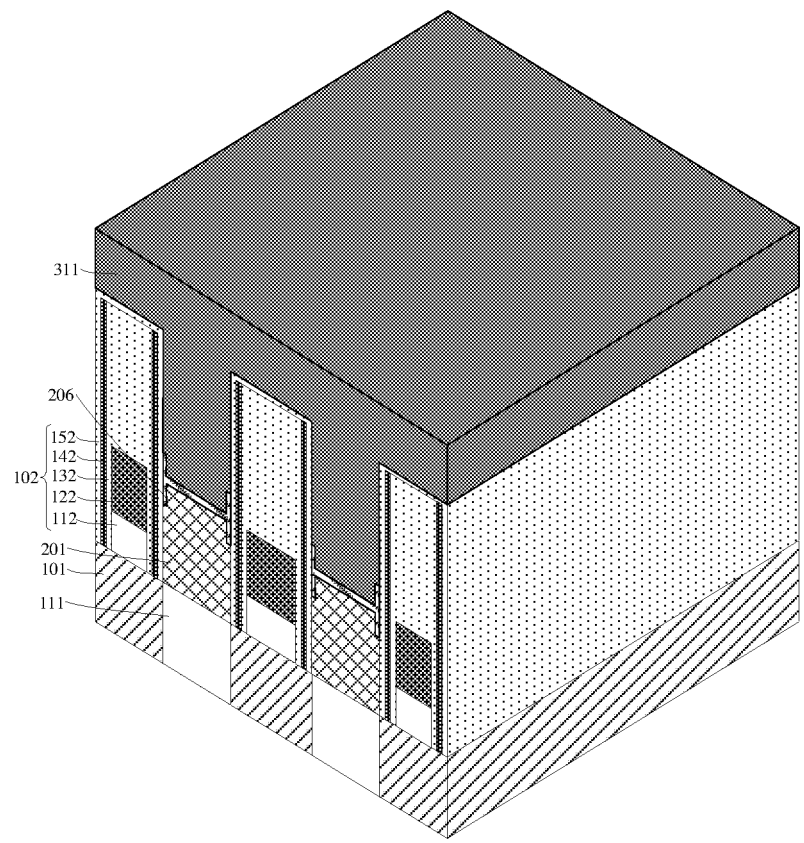

In some embodiments, referring to FIG. 13, a second conductive film 311 filling the capacitor contact openings 104 and covering the bit line structures 102 and the dielectric layers 103 is formed, in which the second conductive film 311 is configured to form the second conductive layers 301 subsequently by etching, the second conductive layers 301 are configured to electrically connect with the first conductive layers 201 through conductive contact layers 206, so as to achieve the electrical connection between the capacitor contact structures formed subsequently and the active areas 111. In an embodiment of the present disclosure, the material of the second conductive film 311 is tungsten, a tungsten complex or the like.

Figure 14:
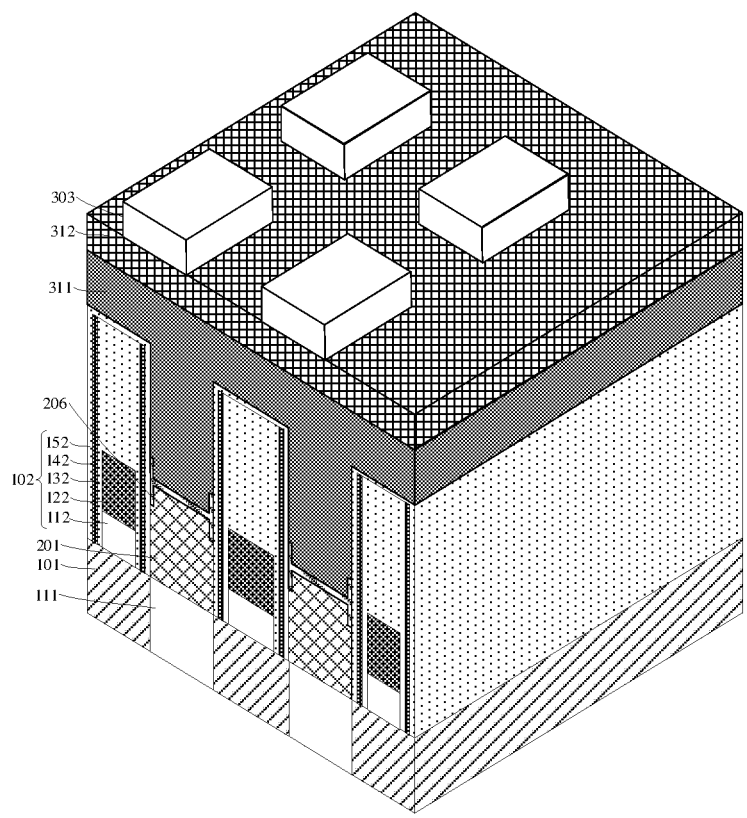
Figure 15:
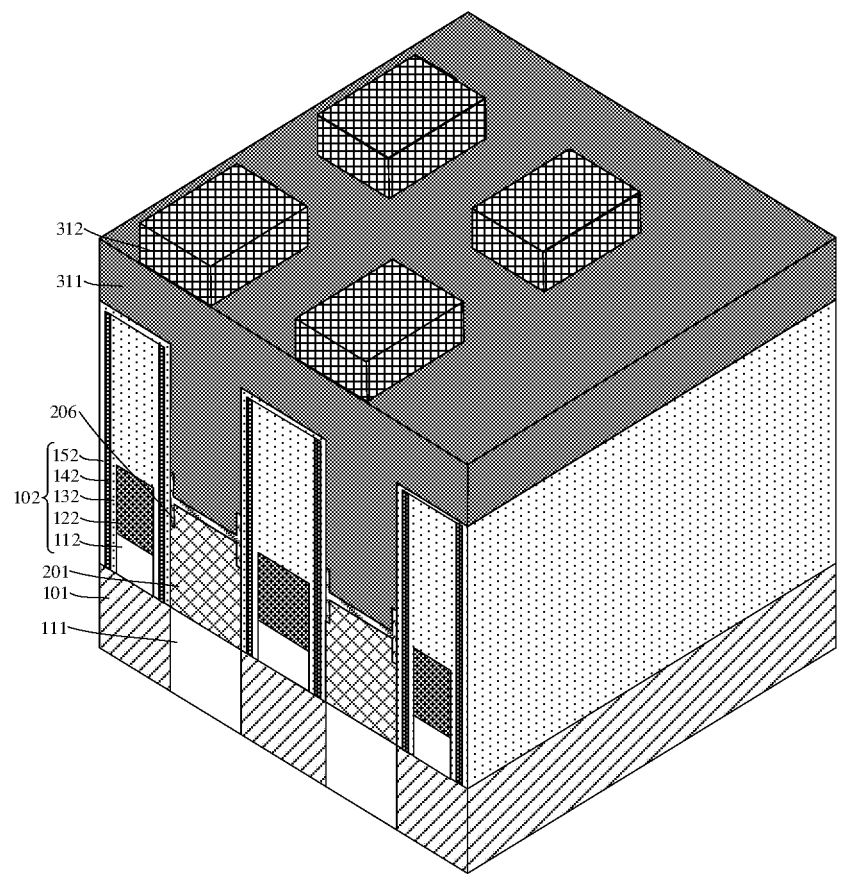
Figure 16:
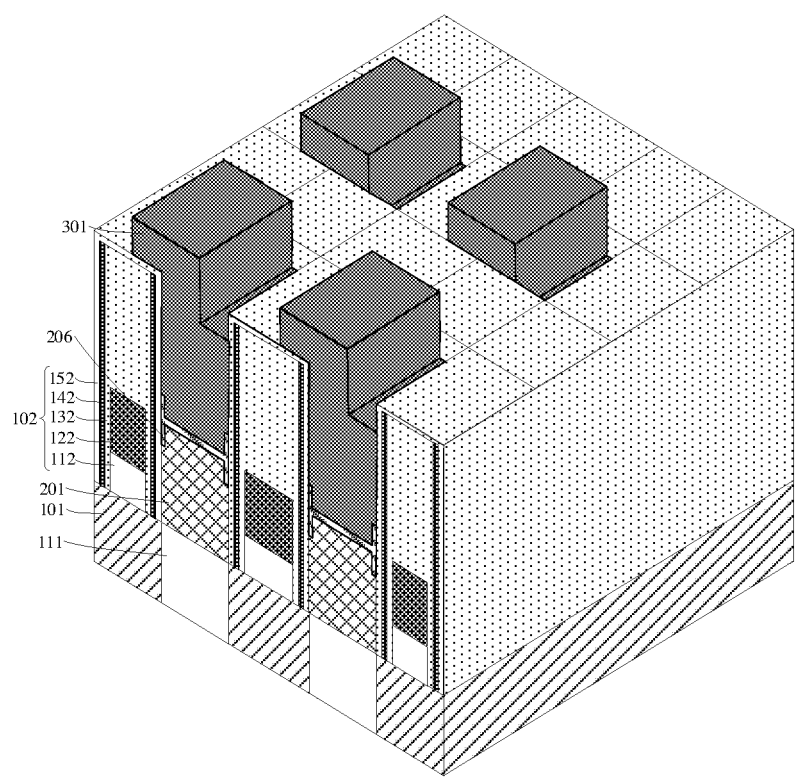

Referring to FIGS. 14-16, the second conductive film 311 is patterned to form the second conductive layers 301.

Referring to FIG. 14, a mask layer 312 and a patterned photoresist 303 are sequentially formed on the second conductive film 311.

Referring to FIG. 15, the mask layer 312 is etched on basis of the patterned photoresist 303 until a top surface of the second conductive film 311 is exposed, and the patterned photoresist 303 is removed.

Referring to FIG. 16, the second conductive film 311 is etched based on the mask layer 312 as shown, until the second conductive layers 301 discretely arranged are formed. The second conductive layers 301 are partially located on the bit line structures 102, and the top surfaces of the second conductive layers located in the capacitor contact openings 104 are lower than the top surfaces of the bit line structures 102.

Figure 17:
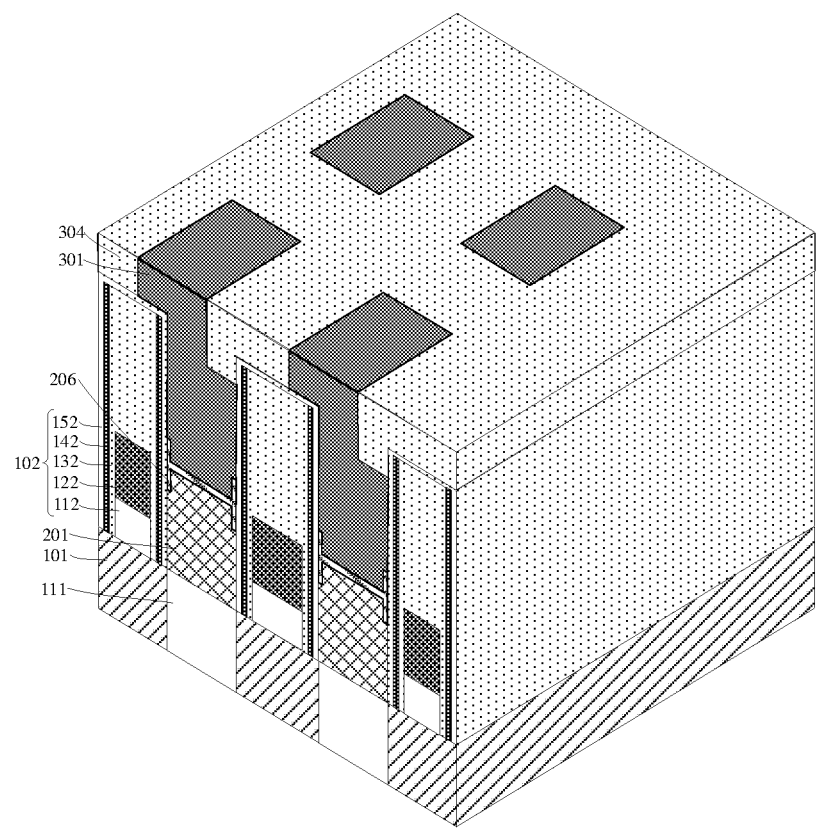

Referring to FIG. 17, an insulating layer 304 filling gaps between the second conductive layers 301 is formed, and is configured to form a capacitor structures subsequently. In this case, the first conductive layer 201, the conductive contact layer 206, and the second conductive layer 301 together constitute the capacitor contact structure filling the capacitor contact opening 104.

Figure 18:
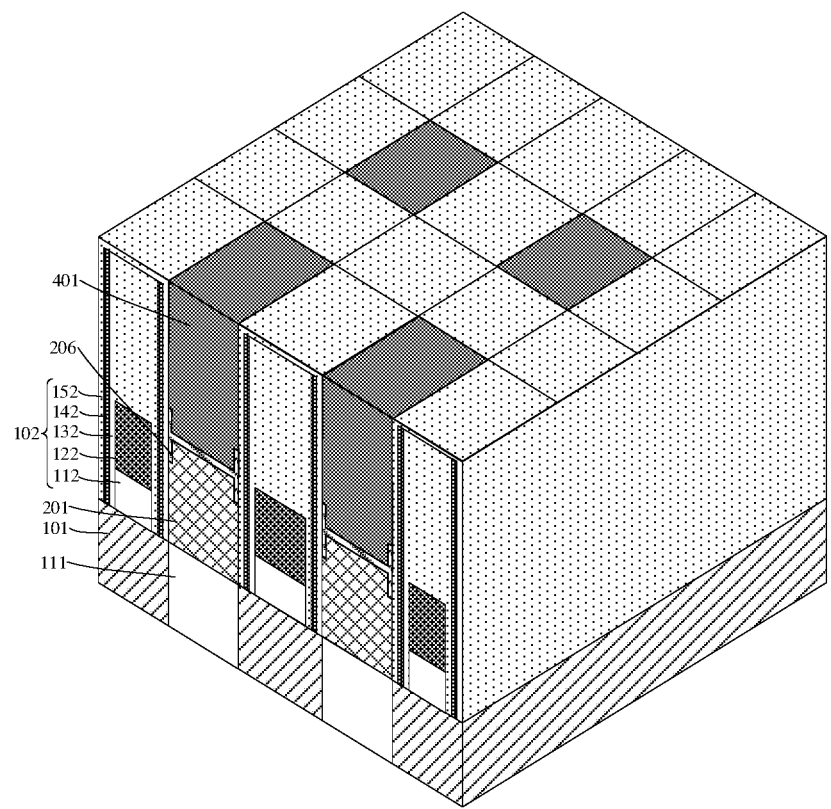

In other embodiments, referring to FIG. 18, second conductive bottom layers 401 filling the capacitor contact openings 104 are formed, in which the top surfaces of the second conductive bottom layers 401 are flush with the top surfaces of the bit line structures 102. In an embodiment of the present disclosure, the material of the second conductive bottom layers 401 is tungsten, a tungsten complex or the like.

Figure 19:
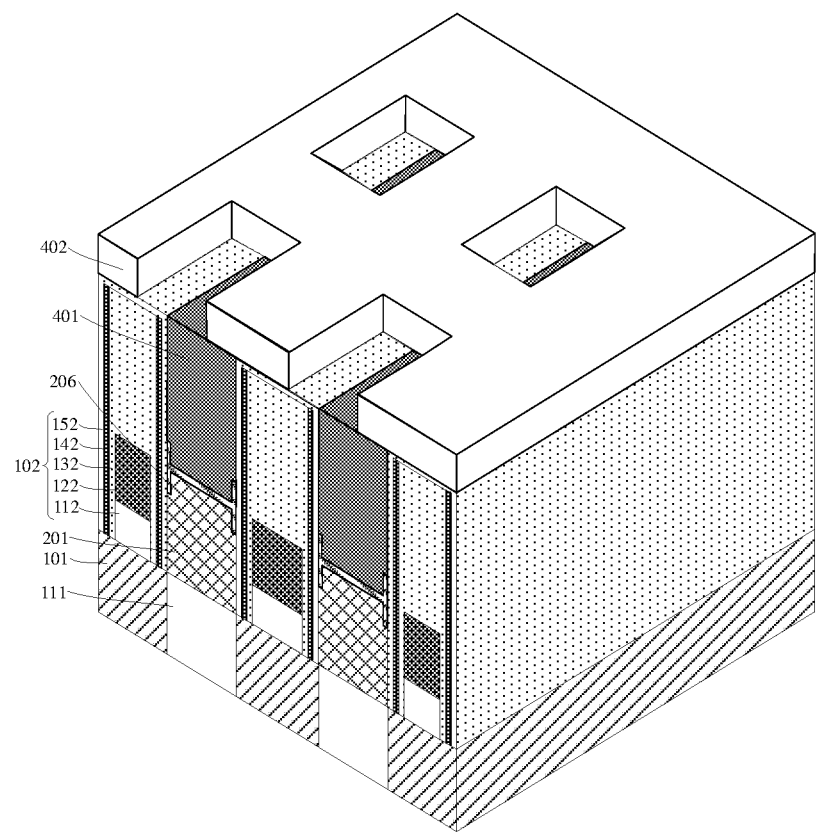

Referring to FIG. 19, a third sacrificial layer 402 is formed on the top surfaces of the second conductive bottom layers 401, the top surfaces of the bit line structures 102 and the top surfaces of the dielectric layers 103. In an embodiment of the present disclosure, the material of the third sacrificial layer 402 may be a photoresist. The third sacrificial layer 402 is patterned to form staggered contact openings, and the staggered contact openings expose a part of the second conductive bottom layers 401.

Figure 20:
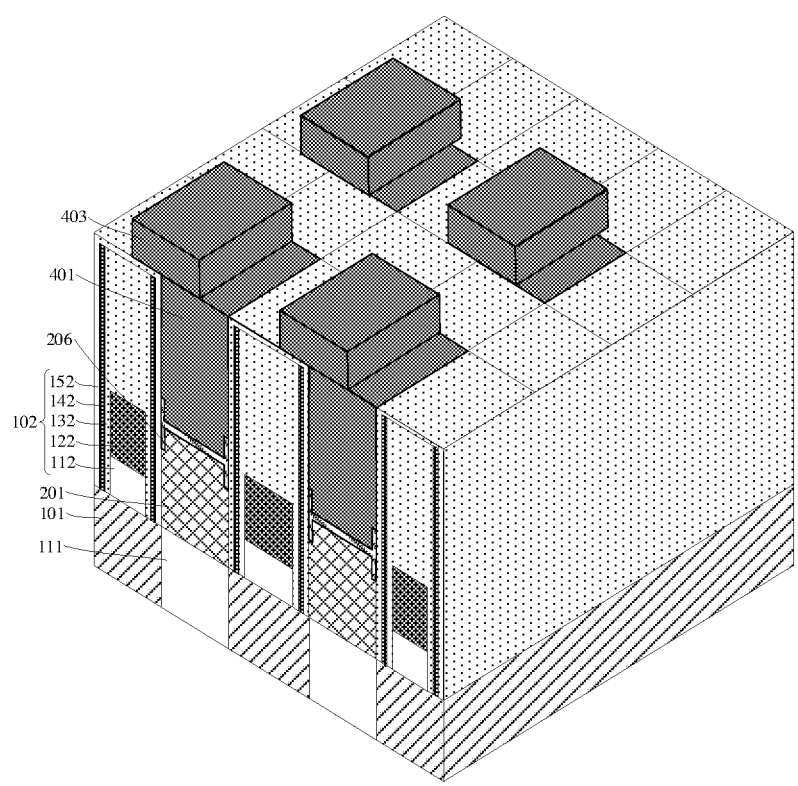

Referring to FIG. 20, second conductive top layers 403 filling the staggered contact openings are formed, in which the material of the second conductive top layers 403 is the same as that of the second conductive bottom layers 401. Each second conductive layer 301 consists of the second conductive top layer 403 and the second conductive bottom layer 401 together.

Figure 21:
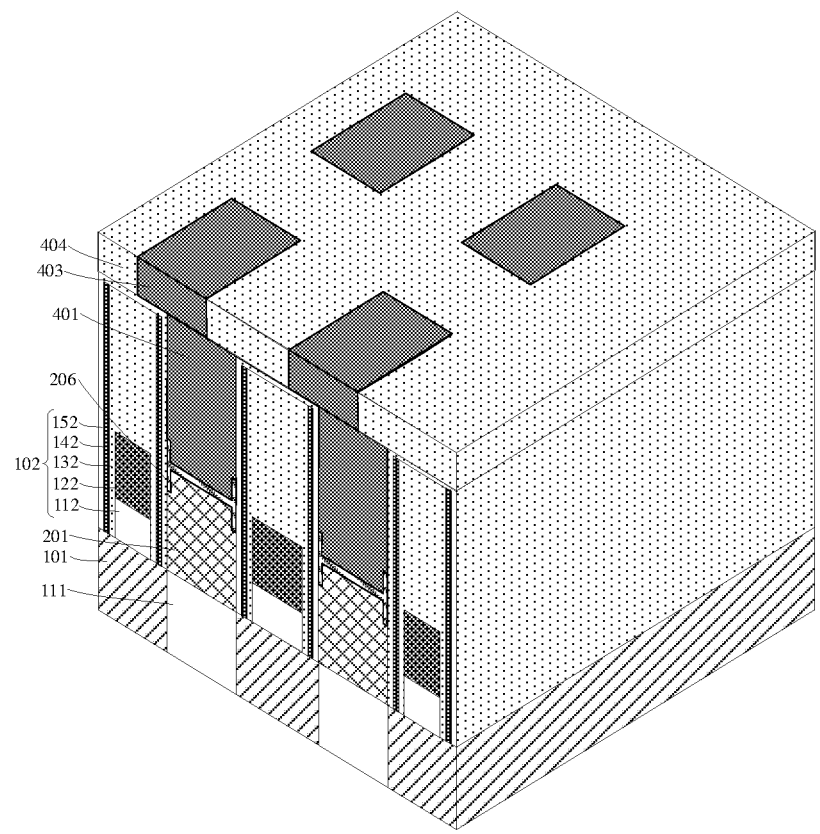

Referring to FIG. 21, the third sacrificial layer 402 is removed by etching and an insulating layer 404 filling gaps between the second conductive top layers 403 is formed, and is configured to form a capacitor structures subsequently. In this case, each capacitor contact structure filling the capacitor contact opening 104 consist of the first conductive layer 201, the conductive contact layer 206, the second conductive top layer 403 and the second conductive bottom layer 401 together.

The staggered openings are formed firstly and then the second conductive layers 301 are formed by filling the staggered contact openings, so that the capacitor contact openings 104 are completely filled with the conductive material, and thus the electrical conductivity of the capacitor contact structures formed subsequently is further improved.

It should be noted that since the function of the third sacrificial layer 402 is to define positions of the staggered contact openings. In an example, referring to FIG. 22, the staggered contact openings may be defined by forming the insulating layer 404, thereby avoiding that after the second conductive top layers 403 are formed, the third sacrificial layer 402 needs to be removed and then the insulating layer 404 is formed.

Figure 22:
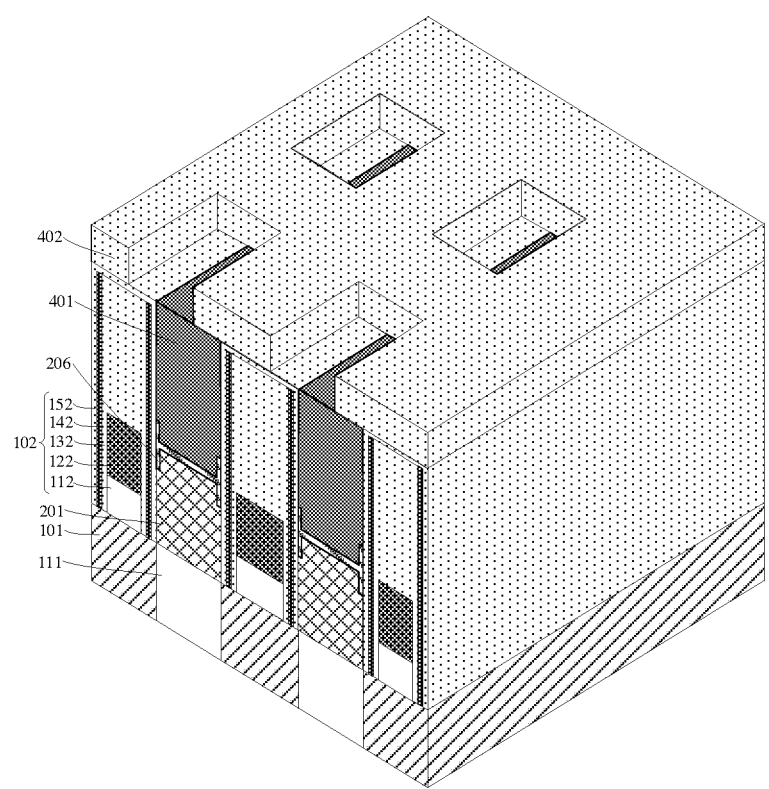

In some embodiments, referring to FIG. 22, an insulating film (not shown) is formed on the top surfaces of the second conductive bottom layers 401, the top surfaces of the bit line structures 102 and the top surfaces of the dielectric layers 103. The insulating film (not shown) is patterned, as to form the staggered contact openings, in which the staggered contact openings expose a part of the second conductive bottom layers 401, and the remaining insulating film serves as the insulating layer 404. Referring to FIG. 21, the second conductive top layers 403 filling the staggered contact openings are formed. Each second conductive layer 301 consist of the second conductive top layer 403 and the second conductive bottom layer 401 together.

Compared with the related art, in the direction perpendicular to the surface of the semiconductor substrate, the conductive contact layers, of which the edge thickness is greater than the middle thickness, are formed, as to increase the contact areas between the first conductive layers and the second conductive layers, thereby reducing the resistance of the formed capacitor contact structures, so that the formed DRAM has a better electrical conductivity.

The division of the various operations above is just for clarity of descriptions. While implemented, they may be combined into one operation or some operations may be split into a plurality of operations. As long as they include a same logical relationship, they are all within a scope of protection of the embodiments of the present disclosure. Insignificant modifications added or insignificant designs introduced to a process without changing a core design of the process are all within the scope of protection of the embodiments of the present disclosure.

Another embodiment of the present disclosure provides a semiconductor structure.

Referring to FIG. 8, FIG. 11, FIG. 12, and FIG. 21, the semiconductor structure provided by the embodiments of the present disclosure is described in detail below, and parts that are the same as or corresponding to the above embodiments are not repeatedly described below.

The semiconductor structure includes a semiconductor substrate 101, first conductive layers 201, conductive contact layers 206, and second conductive layers 301. Bit line structures 102 and dielectric layers 103 are provided on the semiconductor substrate 101, an extension direction of the dielectric layers 103 is intersected with an extension direction of the bit line structures 102, and the bit line structures 102 and the dielectric layers 103 jointly define discrete capacitor contact openings 104. The first conductive layers 201 are located at the bottoms of the capacitive contact openings 104, and top surfaces of the first conductive layers 201 are lower than top surfaces of the bit line structures 102. The conductive contact layers 206 are located on the top surfaces of the first conductive layers 201, and the thickness of a first part and/or the thickness a second part of each conductive contact layer 206 is greater than the thickness of a third part thereof, in which the first part is a part of a conductive contact layer 206 in contact with a bit line structure 102, the second part is a part of the conductive contact layer 206 in contact with the dielectric layer 103, the third part is a middle part of the conductive contact layer 206, and each conductive contact layer 206 consists of the first part, the second part and the third part. The second conductive layers 301 are electrically connected with the conductive contact layers 206, and are configured to adjust an arrangement mode of the capacitor contact structures formed by filling the capacitor contact openings 104.

Buried-type word lines, shallow-groove isolation structures, active areas 111 and other structures are included in the semiconductor substrate 101. Each bit line structure 102 includes a bottom dielectric layer (not shown), a bit line contact layer 112, a metal layer 122, and a top dielectric layer 132 stacked sequentially.

The material of the bit line contact layers 112 includes tungsten or polysilicon. The materials of the bottom dielectric layers (not shown) and the top dielectric layers 135 include silicon nitride, silicon dioxide or silicon oxynitride. The metal layers 122 may be composed of one conductive material or a plurality of conductive materials, such as doped polysilicon, titanium, titanium nitride, tungsten, a tungsten complex and the like.

The material of the dielectric layers 103 includes silicon nitride, silicon dioxide, or silicon oxynitride. In an embodiment of the present disclosure, the material of the dielectric layers 103 may be the same as the material of the top dielectric layers 132.

In an embodiment of the present disclosure, top surfaces and sidewalls of the bit line structures 102 are further covered with a protection structure, in which the protection structure is configured to electrically isolate the bit line structures 102 from the capacitor contact structures formed subsequently.

In some embodiments, the protection structure is a laminated structure which includes a top dielectric layer 132, a second dielectric layer 142 and a third dielectric layer 152 that are sequentially formed on the sidewalls of the bit line structures. The material of the third dielectric layer 152 may be the same as that of the top dielectric layer 132, and the material of the second dielectric layer 142 and the material of the top dielectric layer 132 may be different. The protection structure is implemented in the laminated structure, so as to have a better electrical isolation effect and be configured to reduce a parasitic resistance between the bit line structures 102 and the capacitor contacting structures formed subsequently.

Areas defined by adjacent bit line structures 102 and adjacent dielectric layers 103 serves as the capacitor contact openings 104 which are configured to form the capacitor contact structures subsequently.

The first conductive layers 201 are bottom conductive layers of the capacitor contact structures formed subsequently, and are configured to electrically connect with the active areas 111 in the semiconductor substrate 101. The material of the first conductive layers 201 includes semiconductor conductive materials such as doped polysilicon and polysilicon. In an embodiment of the present disclosure, the material of the first conductive layers 201 is a doped polysilicon.

In an embodiment of the present disclosure, the material of the conductive contact layer 206 is titanium nitride.

In some embodiments, referring to FIG. 8, the first conductive layers 201 have grooves 205. A groove 205 is located in a position of a first conductive layer 201 in contact with bit line structures 102, and a position of the first conductive layer 201 in contact with dielectric layers 103. The conductive contact layers 206 are configured to fill the grooves. Namely, the top surfaces of the first part, the second part, and the third part of each conductive contact layer 206 are at the same level, and the bottom surfaces of the first part and/or the second part are lower than the bottom surface of the third part.

In some embodiments, referring to FIG. 12, each conductive contact layer 206 includes a body part and an extension part, in which the body part is located on the top surface of a first conductive layer 201, and the extension part is located on the sidewalls of bit line structures 102 and/or the sidewalls of dielectric layers 103, and the extension part is also located on the body part. Namely, the bottom surfaces of the first part, the second part, and the third part of each conductive contact layer 206 are at the same level, and the top surfaces of the first part and/or the second part are higher than the top surface of the third part.

In some embodiments, referring to FIG. 11, the first conductive layers 201 have grooves 205, in which a groove 205 is located in a position of a first conductive layer 201 in contact with bit line structures 102, and a position of the first conductive layer 201 in contact with dielectric layers 103. The conductive contact layers 206 are configured to fill the grooves. Each conductive contact layer 206 includes a body part and an extension part, in which the body part is located on the top surface of a first conductive layer 201, and the extension part is located on the sidewalls of bit line structures 102 and/or the sidewalls of dielectric layers 103, and the extension part is also located on the body part. Namely the top surfaces of the first part and/or the second part of each conductive contact layer 206 are higher than the top surface of the third part thereof. The bottom surfaces of the first part and/or the second part are lower than the bottom surface of the third part.

In some embodiments, a first height is less than or equal to a third height, and/or a second height is less than or equal to the third height. The first height is a height of the first parts in a direction perpendicular to the semiconductor substrate, the second height is a height of the second parts in a direction perpendicular to the semiconductor substrate, and the third height is a height of the capacitor contact openings in a direction parallel to the semiconductor substrate. By making the size of edge parts of the formed conductive contact layers 206 smaller than the size of the capacitor contact openings 104, the capacitor contact structures formed subsequently have a higher stability.

Referring to FIG. 21, the second conductive layers 301 include second conductive top layers 403 and second conductive bottom layers 401. The second conductive bottom layers 401 are configured to fill the capacitor contact openings 104, and the second conductive top layers 403 are located on the tops of the second conductive bottom layers 401 and the bit line structures 102, and are configured to adjust an arrangement mode of the capacitor contact structures formed by filling the capacitor contact openings 104.

In an embodiment of the present disclosure, the material of the second conductive layers 301 is tungsten, a tungsten complex or the like.

Compared with the related art, in the direction perpendicular to the surface of the semiconductor substrate, the conductive contact layers, of which the edge thickness is greater than the middle thickness, are formed, so as to increase the contact areas between the first conductive layers and the second conductive layers, thereby reducing the resistance of the formed capacitor contact structures, so that the formed DRAM has a better electrical conductivity.

Since the above embodiments of the method for forming a semiconductor structure are similar to the embodiments of the semiconductor structure of the present disclosure, the embodiments of the present disclosure may be implemented in cooperation with the above embodiments. The technical details mentioned in the above embodiments are still valid in the embodiments of the present disclosure, and the technical effects that may be achieved in the above embodiments may also be achieved in the embodiments of the present disclosure. In order to reduce repetition, they are not repeatedly described here. Correspondingly, the technical details mentioned in the embodiments of the present disclosure may also be applied to the above embodiments.

It is worth mentioning that various modules involved in the embodiments of the present disclosure are all logical modules. In practical applications, a logical unit may be a physical unit, or a part of a physical unit, or may be achieved by a combination of a plurality of physical units. In addition, in order to highlight the innovative part of the present disclosure, units that are not closely related to solving the technical problems proposed by the present disclosure are not introduced in the embodiments of the present disclosure, but this does not indicate that there are no other units in the embodiments of the present disclosure.

A person of ordinary skill in the art may understand that the above embodiments are some embodiments for implementing the present disclosure, but in the actual applications, various changes may be made in forms and details without departing from the spirit and scope of the embodiments of the present disclosure.

The invention claimed is:

1. A method for forming a semiconductor structure, comprising:
    providing a semiconductor substrate, on which bit line structures and dielectric layers that are discretely arranged are formed, wherein an extension direction of the dielectric layers is intersected with an extension direction of the bit line structures, and the bit line structures and the dielectric layers define discrete capacitor contact openings;
    forming first conductive layers filling the capacitor contact openings, wherein top surfaces of the first conductive layers are lower than top surfaces of the bit line structures;
    forming conductive contact layers located on the top surfaces of the first conductive layers, wherein a thickness of a first part and/or a thickness of a second part of each conductive contact layer is greater than a thickness of a third part thereof;
    the first part is a part of one of the conductive contact layers in contact with bit line structures, the second part is a part of the one of the conductive contact layers in contact with the dielectric layers, the third part is a part of the one of the conductive contact layers on the top surfaces of the first conductive layers, and each of the conductive contact layers is constituted by the first part, the second part and the third part together; and
    forming second conductive layers discretely arranged and electrically connected with the conductive contact layers, wherein the second conductive layers are configured to adjust an arrangement mode of the capacitor contact structures formed by filling the capacitor contact openings;
    wherein forming the conductive contact layers located on the top surfaces of the first conductive layers comprises:
    forming grooves in the first conductive layers, wherein each groove is in contact with the bit line structures on one side and in contact with the dielectric layers on another side; and
    forming conductive contact layers filling the grooves and covering the first conductive layers, wherein top surfaces of the conductive contact layers are lower than the top surfaces of the bit line structures.

2. The method for forming a semiconductor structure of claim 1, wherein a first height is less than or equal to a third height, and/or a second height is less than or equal to the third height; wherein, the first height is a height of the first part in a direction perpendicular to the semiconductor substrate, the second height is a height of the second part in the direction perpendicular to the semiconductor substrate, and the third height is a height of capacitor contact openings in a direction parallel to the semiconductor substrate.

3. The method for forming a semiconductor structure of claim 1, wherein forming the first conductive layers for filling the capacitor contact openings comprises:
    forming a first conductive film for filling the capacitor contact openings;
    etching the first conductive film, until discrete first conductive structures are formed; and
    etching the first conductive structures of a partial thickness, so as to form the first conductive layers.

4. The method for forming a semiconductor structure of claim 3, wherein the first conductive film is etched by a chemical mechanical polishing.

5. The method for forming a semiconductor structure of claim 3, wherein forming the conductive contact layers located on the top surfaces of the first conductive layers comprises:
    forming a conductive contact film covering the top surfaces of the first conductive layers, top surfaces and sidewalls of the bit line structures, and top surfaces and sidewalls of the dielectric layers;

forming second sacrificial layers filling openings defined by the conductive contact film; and removing a part of the conductive contact film by etching with the second sacrificial layers as a mask to form the conductive contact layers and etched through holes exposing the conductive contact layers, wherein bottom surfaces of the etched through holes are higher than bottom surfaces of the second sacrificial layers.

6. The method for forming a semiconductor structure of claim 3, wherein forming the second conductive layers comprises:

forming a second conductive film for filling the capacitor contact openings and covering the bit line structures and the dielectric layers; and patterning the second conductive film, as to form the second conductive layers.

7. The method for forming a semiconductor structure claim 3, wherein forming the second conductive layers discretely arranged and electrically connected with the conductive contact layers comprises:

forming second conductive bottom layers for filling the capacitor contact openings, wherein top surfaces of the second conductive bottom layers are flush with top surfaces of bit line contact layers;

forming a third sacrificial layer on the top surfaces of the second conductive bottom layers, the top surfaces of the bit line structures, and top surfaces of the dielectric layers;

patterning the third sacrificial layer to form staggered contact openings, wherein the staggered contact openings expose a part of each second conductive bottom layer;

forming second conductive top layers filling the staggered contact openings, wherein each second conductive layer comprises a second conductive bottom layer and a second conductive top layer; and removing the third sacrificial layer by etching.

8. The method for forming a semiconductor structure of claim 3, wherein forming the second conductive layers discretely arranged and electrically connected with the conductive contact layers comprises:

forming second conductive bottom layers filling the capacitor contact openings, wherein top surfaces of the second conductive bottom layers are flush with top surfaces of the bit line contact layers;

forming an insulating film on the top surfaces of the second conductive bottom layers, the top surfaces of the bit line structures, and top surfaces of the dielectric layers; and patterning the insulating film to form staggered contact openings, wherein the staggered contact openings expose a part of each second conductive bottom layer, and the remaining insulating film serves as an insulating layer; and forming second conductive top layers filling the staggered contact openings, wherein each second conductive layer comprises the second conductive bottom layer and the second conductive top layer.

9. The method for forming a semiconductor structure of claim 1, wherein forming the grooves in the first conductive layers comprises:

forming a first sacrificial layer located on the top surfaces and sidewalls of the bit line structures, top surfaces and sidewalls of the dielectric layers, and tops of the first conductive layers;

forming barrier layers filling the capacitor contact openings;

removing the first sacrificial layer located on the top surfaces and the sidewalls of the bit line structures and the top surfaces and the sidewalls of the dielectric layers by etching with the barrier layers as a mask to form through holes, wherein the through holes expose the first conductive layers;

etching a part of the first conductive layers based on the through holes, as to form the grooves; and removing the barrier layers and the remaining first sacrificial layer.

10. The method for forming a semiconductor structure of claim 7, wherein forming the barrier layers filling the capacitor contact openings comprises:

forming a barrier film filling the capacitor contact openings, wherein a top surface of the barrier film is higher than a top surface of the first sacrificial layer; and partially removing the barrier film, so as to form the barrier layers that are discretely arranged.

11. The method for forming a semiconductor structure of claim 10, wherein the barrier film is partially removed by chemical mechanical polishing.

12. The method for forming a semiconductor structure of claim 1, wherein forming the conductive contact layers filling the grooves and covering the first conductive layers comprises:

forming a conductive contact film for covering the top surfaces of the first conductive layers, the top surfaces and sidewalls of the bit line structures, and the top surfaces and sidewalls of the dielectric layers and filling the grooves;

forming second sacrificial layers filling openings defined by the conductive contact film; and removing a part of the conductive contact film by etching with the second sacrificial layers as a mask to form the conductive contact layers and etched through holes exposing the conductive contact layers, wherein bottom surfaces of the etched through holes are flush with bottom surfaces of the second sacrificial layers.

13. The method for forming a semiconductor structure of claim 1, wherein forming the conductive contact layers filling the grooves and covering the first conductive layers comprises:

forming a conductive contact film for covering the top surfaces of the first conductive layers, the top surfaces and sidewalls of the bit line structures, and the top surfaces and sidewalls of the dielectric layers and filling the grooves;

forming second sacrificial layers filling openings in the conductive contact film; and removing a part of the conductive contact film by etching with the second sacrificial layers as a mask to form the conductive contact layers and etched through holes for exposing the conductive contact layers, wherein bottom surfaces of the etched through holes are higher than bottom surfaces of the second sacrificial layers.

14. A semiconductor structure, comprising:

a semiconductor substrate, on which bit line structures and dielectric layers are provided, wherein an extension direction of the dielectric layers is intersected with an extension direction of the bit line structures, and the bit line structures and the dielectric layers jointly define discrete capacitor contact openings;

first conductive layers, located at the bottoms of the capacitor contact openings, wherein top surfaces of the first conductive layers are lower than top surfaces of the bit line structures;

conductive contact layers, located on the top surfaces of the first conductive layers, wherein a thickness of a first part and/or a thickness of a second part of each conductive contact layer is greater than a thickness of a third part thereof, wherein the first part is a part of one of conductive contact layers in contact with bit line structures, the second part is a part of the one of the conductive contact layers in contact with the dielectric layers, the third part is a part of the one of the conductive contact layers on the top surfaces of the first conductive layers, and each of the conductive contact layers is constituted by the first part, the second part and the third part together; and second conductive layers, electrically connected with the conductive contact layers, and configured to adjust an arrangement mode of capacitor contact structures formed by filling the capacitor contact openings;

wherein the thickness of the first part and/or the thickness of the second part of each conductive contact layer is greater than the thickness of the third part thereof, comprising:

each first conductive layer has a groove, wherein each groove is in contact with the bit line structures on one side and in contact with the dielectric layers on another side.

15. The semiconductor structure of claim 14, wherein a first height is less than or equal to a third height, and/or a second height is less than or equal to the third height; wherein, the first height is a height of the first part in a direction perpendicular to the semiconductor substrate, the second height is a height of the second part in the direction perpendicular to the semiconductor substrate, and the third height is a height of each capacitor contact opening in a direction parallel to the semiconductor substrate.

16. The semiconductor structure of claim 14, wherein each conductive contact layer comprises a body part and an extension part, the body part is located on a top surface of a first conductive layer, the extension part is located on sidewalls of bit line structures and/or sidewalls of the dielectric layers, and the extension part is also located on the body part.

17. The semiconductor structure of claim 14, wherein each second conductive layer comprises a second conductive top layer and a second conductive bottom layer;

the second conductive bottom layer is configured to fill a capacitor contact opening; and the second conductive top layer is located on a top of the second conductive bottom layer and a bit line structure, and is configured to adjust an arrangement mode of a capacitor contact structure formed by filling the capacitor contact opening.

* * * * *